United States Patent
Wu et al.

(10) Patent No.: US 11,631,835 B2
(45) Date of Patent: Apr. 18, 2023

(54) OLED DISPLAY PANEL AND OLED DISPLAY DEVICE

(71) Applicant: BOE Technology Group Co., Ltd., Beijing (CN)

(72) Inventors: Changyen Wu, Beijing (CN); Guang Yan, Beijing (CN); Wenfeng Song, Beijing (CN); Linlin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 400 days.

(21) Appl. No.: 16/768,279

(22) PCT Filed: Jan. 19, 2020

(86) PCT No.: PCT/CN2020/072987
§ 371 (c)(1),
(2) Date: May 29, 2020

(87) PCT Pub. No.: WO2020/151616
PCT Pub. Date: Jul. 30, 2020

(65) Prior Publication Data
US 2021/0210731 A1 Jul. 8, 2021

(30) Foreign Application Priority Data

Jan. 23, 2019 (CN) .......................... 201910062672.8

(51) Int. Cl.
*H01L 51/52* (2006.01)
*H01L 27/32* (2006.01)

(52) U.S. Cl.
CPC ...... *H01L 51/5268* (2013.01); *H01L 51/5281* (2013.01); *H01L 27/3244* (2013.01); *H01L 2251/5315* (2013.01)

(58) Field of Classification Search
CPC . H01L 51/5268; H01L 51/52; H01L 51/5281; H01L 27/3244; H01L 27/32; H01L 2251/5315
See application file for complete search history.

(56) References Cited

U.S. PATENT DOCUMENTS

| | | | |
|---|---|---|---|
| 2011/0147721 A1 | 6/2011 | Han | |
| 2012/0267666 A1 | 10/2012 | Hirakata et al. | |
| 2016/0190514 A1 | 6/2016 | Masuda | |
| 2018/0120646 A1* | 5/2018 | Lee | H01L 27/322 |
| 2018/0151843 A1* | 5/2018 | Ma | H01L 51/5234 |
| 2019/0265547 A1* | 8/2019 | Naismith | G02F 1/133536 |

FOREIGN PATENT DOCUMENTS

| | | |
|---|---|---|
| CN | 102301409 A | 12/2011 |
| CN | 106299150 A | 1/2017 |
| CN | 106373986 A | 2/2017 |
| CN | 108008564 A | 5/2018 |
| CN | 109755414 A | 5/2019 |
| CN | 209216976 U | 8/2019 |
| EP | 2359421 B2 | 7/2018 |

OTHER PUBLICATIONS

First Office Action dated Feb. 6, 2020 corresponding to Chinese application No. 201910062672.8.
Second Office Action dated Jul. 10, 2020 corresponding to Chinese application No. 201910062672.8.

* cited by examiner

*Primary Examiner* — Calvin Y Choi
(74) *Attorney, Agent, or Firm* — Nath, Goldberg & Meyer; Joshua B. Goldberg

(57) ABSTRACT

The present disclosure provides an OLED display panel and an OLED display device, and belongs to the field of display technology. The OLED display panel of the present disclosure includes a base substrate and a display cover disposed opposite to each other; a polarizing layer disposed between the base substrate and the display cover; a light extraction layer disposed between the base substrate and the display cover; the OLED display panel is provided with a light exit surface, and the light extraction layer is closer to the light exit surface than the polarizing layer.

13 Claims, 1 Drawing Sheet

OLED DISPLAY PANEL AND OLED DISPLAY DEVICE

CROSS-REFERENCE TO RELATED APPLICATIONS

This is a National Phase application filed under 35 U.S.C. 371 as a national stage of PCT/CN2020/072987, filed Jan. 19, 2020, an application claiming the benefit of Chinese Application No. 201910062672.8, filed Jan. 23, 2019, the content of each of which is hereby incorporated by reference in its entirety.

TECHNICAL FIELD

The present disclosure belongs to the field of display technology, and particularly relates to an OLED display panel and an OLED display device.

BACKGROUND

At present, the External Quantum Efficiency (EQE) theoretical value of the OLED display panel is only about 20%, and the light extraction efficiency is only 20%-25%, which is the bottleneck of the efficiency of the OLED display panel at present.

SUMMARY

The present disclosure provides an OLED display panel and an OLED display device.

An OLED display panel includes a base substrate and a display cover oppositely disposed; a polarizing layer disposed between the base substrate and the display cover; and a light extraction layer disposed between the base substrate and the display cover; and the OLED display panel is provided with a light exit surface, and the light extraction layer is closer to the light exit surface than the polarizing layer.

In one embodiment, a refractive index of the light extraction layer is the same as a refractive index of the polarizing layer.

In one embodiment, the refractive index of the light extraction layer is 1.8-2.2.

In one embodiment, a material of the light extraction layer comprises scattering particles.

In one embodiment, the scattering particles comprise silicon oxide particles.

In one embodiment, the OLED display panel further includes at least one OLED display device having a light emitting surface; and the polarizing layer is located on a side of the light emitting surface of the OLED device.

In one embodiment, the OLED display panel further includes at least one thin film transistor, which is respectively coupled to the at least one OLED display device to control light emission thereof.

In one embodiment, the OLED display device is a top-emission type OLED display device; the OLED display device, the polarizing layer and the light extraction layer are sequentially disposed on the base substrate along a direction distal to the base substrate.

In one embodiment, the OLED display device is a bottom-emission type OLED display device; the light extraction layer, the polarizing layer and the OLED display device are sequentially disposed on the base substrate along a direction distal to the base substrate.

The present disclosure also provides an OLED display device including any one of the above OLED display panels.

DETAILED DESCRIPTION

In order to make a person skilled in the art better understand the technical solutions of the present disclosure, the following detailed description is given with reference to the accompanying drawings and the specific embodiments.

In the related art, there are various light extraction structures for OLED display panels, to be used to improve the light extraction efficiency of the OLED display panels. The light extraction structures are for example scattering particles, micro-lens structures, rough glass surfaces, low refractive index grating structures, etc. According to the differences of the structures, the light extraction structures can be divided into two types, EES (external extraction structure) and IES (internal extraction structure), and the IES light extraction structure has a better effect of improving the brightness of the OLED display panel.

In the related art, when the IES light extraction structure is applied to an OLED display panel, the bright room contrast of the OLED display panel is greatly reduced, which results in the fact that the structure cannot be used in a normal outdoor environment with ambient light.

Figure 1:
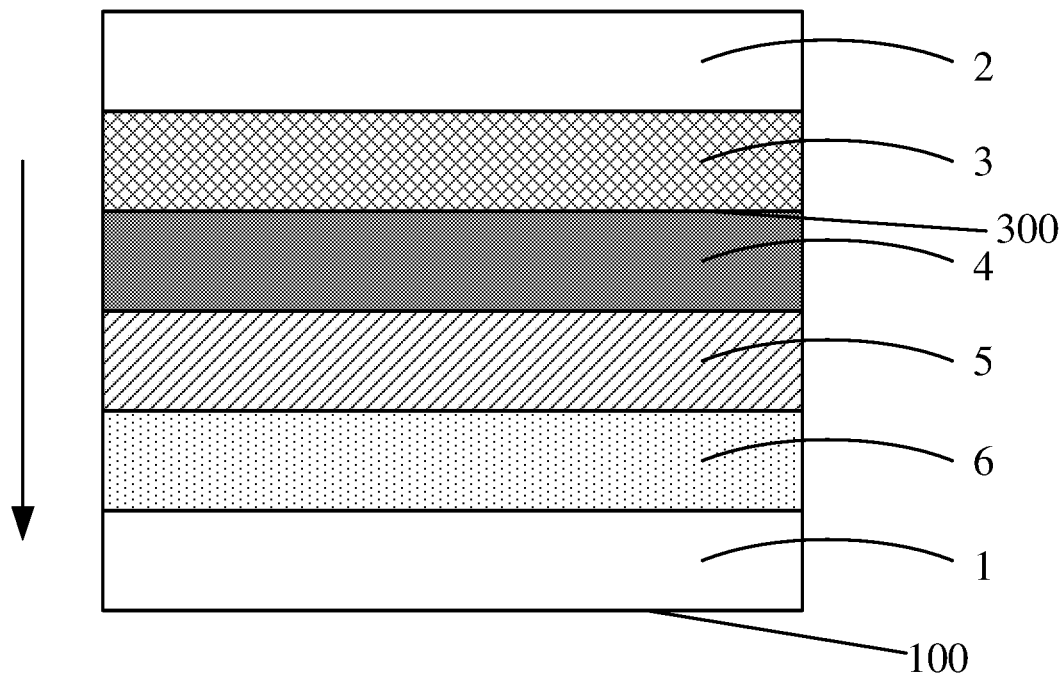
FIG. 1 is a schematic view of a structure of an OLED display panel according to an embodiment of the present disclosure.
Figure 2:
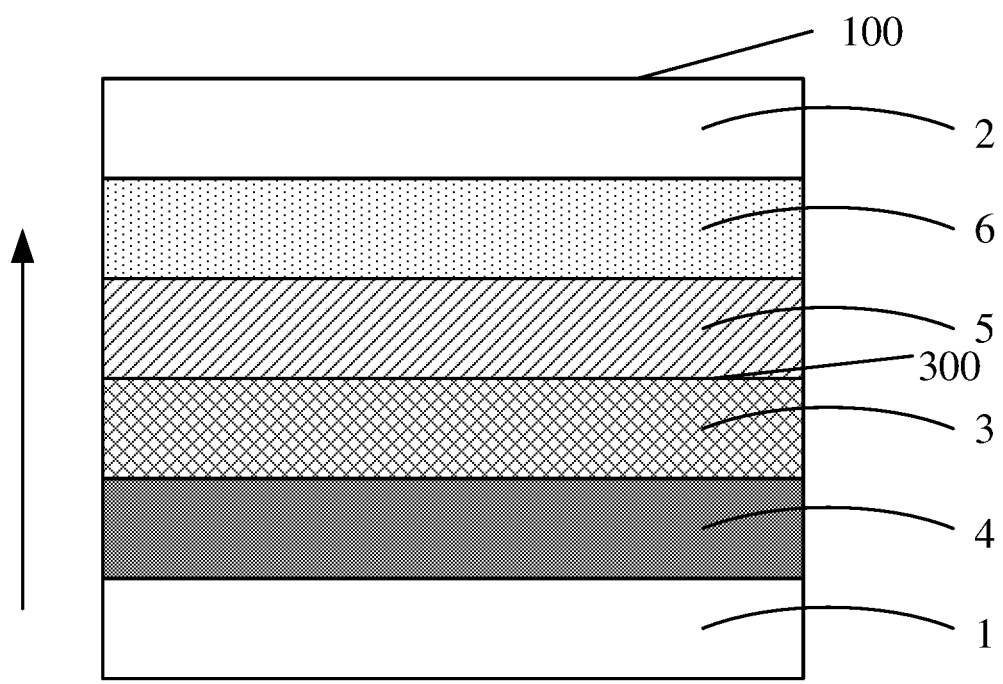
FIG. 2 is a schematic view of a structure of an OLED display panel according to an embodiment of the present disclosure.

As shown in FIGS. 1 and 2, the present embodiment provides an OLED display panel including: a polarizing layer 5, a light extraction layer 6, and a base substrate 1 and a display cover 2 disposed opposite to each other; the polarizing layer 5 is disposed between the base substrate 1 and the display cover 2; the light extraction layer 6 is disposed between the base substrate 1 and the display cover 2; the OLED display panel has a light exit surface 100, and the light extraction layer 6 is closer to the light exit surface 100 than the polarizing layer 5.

As shown in FIGS. 1 and 2, the OLED display panel further includes an OLED display device 3 disposed on the base substrate 1. The light exit surface 100 of the OLED display panel is determined by the light emitting direction of the OLED display device 3 (i.e. the light emitting surface 300 of the OLED display device 3). The polarizing layer 5 and the light extraction layer 6 are disposed between the base substrate 1 and the display cover 2, and both are located on a side of the light emission direction of the OLED display device 3, and the polarizing layer 5 is closer to the OLED display device 3 than the light extraction layer 6.

The polarizing layer 5 is used for filtering out the external ambient light entering the OLED display panel according to the polarization principle, so as to prevent the external ambient light from affecting the bright room contrast of the OLED display panel. The light extraction layer 6 is used to improve the light extraction efficiency of the OLED display device 3.

As shown in FIGS. 1 and 2, in the present embodiment, the light extraction layer 6 is located inside the OLED display panel, so that the light extraction efficiency of the OLED display panel can be significantly improved.

With the arrangement of the light extraction layer 6 and the polarization layer 5 in this embodiment, the external ambient light will not be emitted outside from the OLED display panel after entering the OLED display panel.

Specifically, when an external ambient light entering the polarizing layer 5 of the OLED display panel from the outside is converted into a polarized light propagating along a certain direction by the polarizing layer 5 (only the ambient light polarized along a specific direction can propagate through the polarizing layer 5), and after reflection, the polarization direction changes, and is different from the original polarization direction, so that when returning to the polarizing layer 5 again, the polarization direction changes, so that the polarized light cannot be emitted from the polarizing layer 5 and cannot be emitted outside from the OLED display panel. Since the light extraction layer 6 is located on the side of the polarizing layer 5 distal to the OLED display device 3 in this embodiment, the external ambient light passes through the polarizing layer 5 to form the polarized light, and does not pass through the light extraction layer 6 in the process of being reflected back to the polarizing layer 5, so that the external ambient light is not affected by the light extraction layer 6 in the transmission process to disturb the polarization characteristics of the external ambient light. That is to say, in the OLED display panel in this embodiment, after the external environment light enters the OLED display panel, the polarization direction of the polarized light filtered by the polarizing layer 5 is changed when the polarized light is reflected, so that the polarized light is completely unable to pass therethrough when returning to the polarizing layer 5, that is, the external environment light is finally not emitted from the OLED display panel, and therefore, the normal display of the OLED display panel is not affected, and the OLED display panel has a higher bright room contrast.

In summary, the OLED display panel in the embodiment has a high light-extraction efficiency and a high bright room contrast, so that the OLED display panel can well display in an outdoor environment with strong light, and has high light emitting efficiency.

In this embodiment, the OLED display device 3 may be a top-emission type OLED display device or a bottom-emission type OLED display device. In order to more clearly and specifically explain the embodiments, two embodiments are described below.

In one embodiment of the present disclosure, the OLED display device 3 in the OLED display panel is a bottom-emission type OLED display device, and the light exit direction thereof is the direction indicated by the arrow in FIG. 1.

Specifically, as shown in FIG. 1, a light extraction layer 6, a polarizing layer 5, and an OLED display device 3 are sequentially disposed on a base substrate 1 in a direction distal to the base substrate 1 (a direction from the bottom to the top in FIG. 1). The OLED display device 3 may include an anode, an organic light emitting layer, a cathode, and the like, which are sequentially disposed along a direction distal to the base substrate 1. The structure of each layer of the OLED display device 3 may adopt the structure of the bottom-emission OLED display device 3 in the prior art, for example, the OLED display device 3 includes an opaque metal cathode, an organic functional layer, and a transparent anode (e.g., ITO). In this embodiment, a cathode is taken as an example of a reflection cathode.

In this embodiment, the light extraction layer 6 is disposed inside the OLED display panel and is closer to the OLED display device 3 than that in the prior art, so that the light-extraction efficiency of the OLED display panel can be improved, and the display brightness of the OLED display panel is obviously improved under the same driving power. Meanwhile, since the light extraction layer 6 is located outside the polarization layer 5 in this embodiment (the light extraction layer 6 is closer to the light exit surface of the OLED display panel than the polarization layer 5), the light extraction layer 6 has no influence on the following case: when external ambient light enters the OLED display panel, the external ambient light first enters the light extraction layer 6 through the base substrate 1 and then enters the polarization layer 5, only polarized light propagating in a certain direction in the polarization layer 5 passes through and continues to transmit, when the polarized light reaches the reflection cathode, the polarized light is reflected by the reflection cathode and then continues to transmit, and the polarization direction of the polarized light is changed (different from the original polarization direction) when being reflected, when the polarized light enters the polarization layer 5 again, the polarization direction of the polarized light and the polarization direction of the polarization layer 5 are different from each other, and at this time, the polarized light cannot exit the polarization layer 5. Therefore, the external ambient light cannot exit the OLED display panel, and the display of the OLED display panel is not affected.

Optionally, in this embodiment, the refractive index of the light extraction layer 6 is the same as the refractive index of the polarizing layer 5. When the refractive indexes of the light extraction layer 6 and the polarization layer 5 are the same, the light refraction matching degree between the light extraction layer 6 and the polarization layer 5 is high, so that light can escape easily, and the light-extraction efficiency of the OLED display device 3 is ensured.

Further alternatively, the refractive index of the light extraction layer 6 is between 1.8 and 2.2.

Specifically, the material of the light extraction layer 6 may include scattering particles, such as silicon oxide particles, by which the light extraction layer 6 is formed, and the light-extraction efficiency of the OLED display panel is improved based on the principle of light scattering. Of course, other types of light extraction layers 6 that can be used inside the OLED display panel are also possible, and are not listed herein.

It can be understood that, the OLED display panel in this embodiment further includes a thin film transistor 4, and the thin film transistor 4 is correspondingly connected to the OLED display device 3 to control the light emission of the OLED display device 3.

In another embodiment of the present disclosure, the OLED display device 3 in the OLED display panel is a top-emission type OLED display device, and the light emission direction thereof is the direction indicated by the arrow in FIG. 2.

Specifically, as shown in FIG. 2, the OLED display device 3, the polarizing layer 5, and the light extraction layer 6 are sequentially disposed on the base substrate 1 in a direction distal to the base substrate 1. The OLED display device 3 may include an anode, an organic light emitting layer, a cathode, and the like, which are sequentially disposed in a direction distal to the base substrate 1. The structure of each layer of the OLED display device 3 may be the structure of a top-emitting OLED display device in the prior art, for example, the material of the anode may be silver (Ag), indium tin oxide/silver/indium tin oxide (ITO/Ag/ITO), or nickel-chromium alloy (Ni: Cr alloy); the organic light-emitting layer can be made of tris (8-hydroxyquinoline)

aluminum (Alq3), and can improve the electron injection for the cathode of the top-emitting OLED display device; the cathode material may be a translucent cathode, and the material of the cathode may include: CuPc (copper phthalocyanine) or magnesium silver alloy (Mg: Ag alloy).

When the external ambient light enters the OLED display panel, the external ambient light first enters the light extraction layer 6 through the display cover 2, and then enters the polarization layer 5, only the polarized light propagating along a certain direction in the polarization layer 5 passes through and continues to transmit, and when the polarized light meets the reflection layer (for example, the reflection electrode may be an anode), the polarized light is reflected back to the polarization layer 5. Since the polarization direction of the polarized light is changed (perpendicular to the original polarization direction) when the polarized light is reflected, the polarized light cannot pass through the polarizing layer 5 to be emitted outside when the polarized light enters the polarizing layer 5 again. Meanwhile, in this embodiment, the light extraction layer 6 is disposed inside the OLED display panel and is closer to the OLED display device 3 than that in the prior art, so that the light-extraction efficiency of the OLED display panel can be increased, and the display brightness of the OLED display panel is significantly increased under the same driving power.

An embodiment of the present disclosure also provides an OLED display device including any one of the OLED display panels provided in the above embodiments.

Specifically, the OLED display device can be any product or component with a display function, such as a mobile phone, a tablet computer, a television, a display, a notebook computer, and an advertisement screen.

Because the OLED display device of this embodiment includes the OLED display panel in the above embodiment, the OLED display device not only has a higher light-extraction efficiency, but also has a higher bright room contrast, so that the OLED display device can not only perform good display in an outdoor environment with stronger light, but also has higher light emitting efficiency.

It will be understood that, the above embodiments are merely exemplary embodiments employed to illustrate the principles of the present disclosure, and the present disclosure is not limited thereto. It will be apparent to a person skilled in the art that various changes and modifications can be made therein without departing from the spirit and scope of the disclosure, and these changes and modifications are to be considered within the scope of the disclosure.

What is claimed is:

1. An OLED display panel, comprising:
a base substrate and a display cover disposed opposite to each other;
a polarizing layer disposed between the base substrate and the display cover; and
a light extraction layer disposed between the base substrate and the display cover;
wherein, the OLED display panel is provided with a light exit surface, and the light extraction layer is closer to the light exit surface than the polarizing layer;
wherein the OLED display panel further comprises at least one OLED display device having a light emitting surface, and the polarizing layer is located on a side of the light emitting surface of the OLED display device;
the OLED display device comprises a first electrode and a second electrode which is a reflection electrode, and a light emitting layer between the first electrode and the second electrode, and the first electrode is one of an anode and a cathode, and the second electrode is the other one of the anode and the cathode;
the second electrode which is the reflection electrode is farther away from the polarizing layer than the first electrode; and
a material of the light extraction layer comprises scattering particles.

2. The OLED display panel of claim 1, wherein,
a refractive index of the light extraction layer is the same as a refractive index of the polarizing layer.

3. The OLED display panel of claim 2, wherein,
the refractive index of the light extraction layer is 1.8-2.2.

4. The OLED display panel of claim 1, wherein,
the scattering particles comprise silicon oxide particles.

5. The OLED display panel of claim 1, further comprising: at least one thin film transistor, which is correspondingly coupled to the at least one OLED display device respectively to control light emission.

6. The OLED display panel of claim 1, wherein the OLED display device is a top-emission type OLED display device; and
the OLED display device, the polarizing layer and the light extraction layer are sequentially disposed on the base substrate along a direction distal to the base substrate.

7. The OLED display panel of claim 1, wherein the OLED display device is a bottom-emitting OLED display device; and
the light extraction layer, the polarizing layer and the OLED display device are sequentially disposed on the base substrate along a direction distal to the base substrate.

8. An OLED display device comprising the OLED display panel of claim 1.

9. The OLED display panel of claim 5, wherein the OLED display device is a top-emission type OLED display device; and
the OLED display device, the polarizing layer and the light extraction layer are sequentially disposed on the base substrate along a direction distal to the base substrate.

10. The OLED display panel of claim 5, wherein the OLED display device is a bottom-emitting OLED display device; and
the light extraction layer, the polarizing layer and the OLED display device are sequentially disposed on the base substrate along a direction distal to the base substrate.

11. The OLED display device of claim 8, wherein,
a refractive index of the light extraction layer is the same as a refractive index of the polarizing layer.

12. The OLED display device of claim 11, wherein,
the refractive index of the light extraction layer is 1.8-2.2.

13. The OLED display device of claim 8, wherein,
the scattering particles comprise silicon oxide particles.

* * * * *